(12) United States Patent
Mallardeau et al.

(10) Patent No.: US 7,259,414 B2
(45) Date of Patent: Aug. 21, 2007

(54) INTEGRATED CIRCUIT, ITS FABRICATION PROCESS AND MEMORY CELL INCORPORATING SUCH A CIRCUIT

(75) Inventors: Catherine Mallardeau, Grenoble (FR); Pascale Mazoyer, Domene (FR); Marc Piazza, Pontcharra (FR)

(73) Assignee: STMicroelectronics SA, Montrouge (FR)

( * ) Notice: Subject to any disclaimer, the term of this patent is extended or adjusted under 35 U.S.C. 154(b) by 28 days.

(21) Appl. No.: 10/486,950

(22) PCT Filed: Aug. 14, 2002

(86) PCT No.: PCT/FR02/02885

§ 371 (c)(1),
(2), (4) Date: Aug. 20, 2004

(87) PCT Pub. No.: WO03/017360

PCT Pub. Date: Feb. 27, 2003

(65) Prior Publication Data

US 2004/0266099 A1 Dec. 30, 2004

(30) Foreign Application Priority Data

Aug. 16, 2001 (FR) .................. 01 10868

(51) Int. Cl.
*H01L 27/108* (2006.01)
*H01L 29/76* (2006.01)
*H01L 29/94* (2006.01)
*H01L 31/119* (2006.01)

(52) U.S. Cl. ............ 257/301; 257/306; 257/309; 257/E27.089; 257/296

(58) Field of Classification Search ........ 257/306–309, 257/E27.089, E21.648, 301; 438/253, 255, 438/396

See application file for complete search history.

(56) References Cited

U.S. PATENT DOCUMENTS

| 5,317,193 | A | * | 5/1994 | Watanabe | 257/774 |
| 5,731,610 | A | * | 3/1998 | Rhodes | 257/309 |
| 5,827,770 | A | * | 10/1998 | Rhodes et al. | 438/396 |
| 5,874,756 | A | * | 2/1999 | Ema et al. | 257/296 |
| 6,281,535 | B1 | * | 8/2001 | Ma et al. | 257/295 |
| 6,284,589 | B1 | * | 9/2001 | Lim et al. | 438/240 |
| 6,313,497 | B1 | * | 11/2001 | Iwasa | 257/306 |
| 6,344,413 | B1 | * | 2/2002 | Zurcher et al. | 438/678 |
| 6,483,167 | B1 | * | 11/2002 | Nabatame et al. | 257/532 |
| 6,559,497 | B2 | * | 5/2003 | Shih et al. | 257/306 |
| 6,710,389 | B2 | * | 3/2004 | Shibata | 257/301 |

\* cited by examiner

*Primary Examiner*—B. William Baumeister
*Assistant Examiner*—Igwe U. Anya
(74) *Attorney, Agent, or Firm*—Lisa K. Jorgenson; Stephen Bongini; Fleit Kain Gibbons Gutman Bongini & Bianco P.L.

(57) ABSTRACT

This integrated circuit comprises a capacitor (23) formed above a substrate (1) inside a first cavity in a dielectric and comprising a first electrode, a second electrode, a thin dielectric layer placed between the two electrodes, and a structure (7) for connection to the capacitor.

The connection structure is formed at the same level as the capacitor in a second cavity narrower than the first cavity, the said second cavity being completely filled by an extension of at least one of the electrodes of the capacitor.

17 Claims, 7 Drawing Sheets

FIG_1
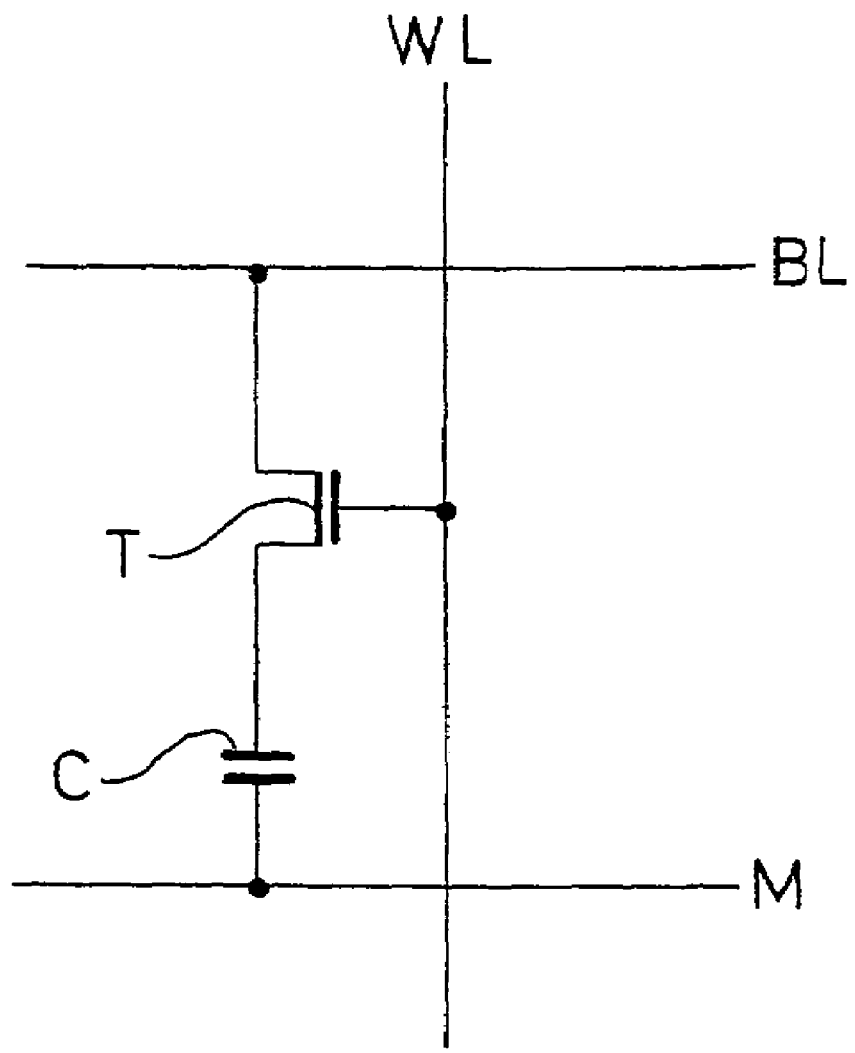

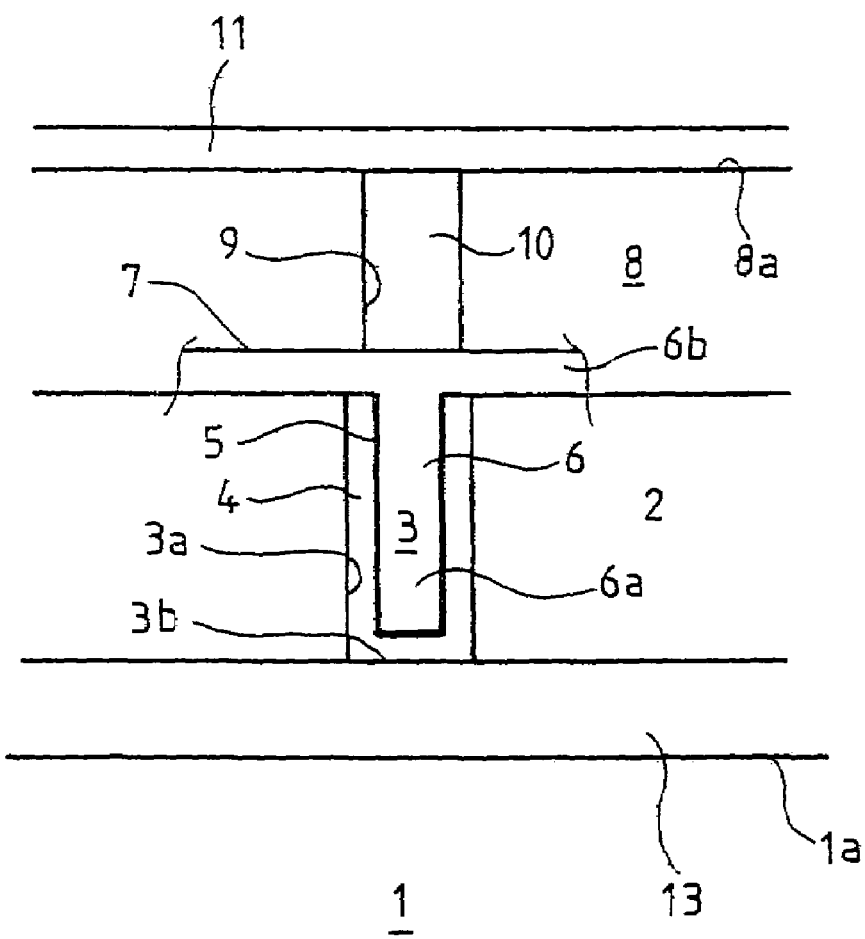

FIG_3
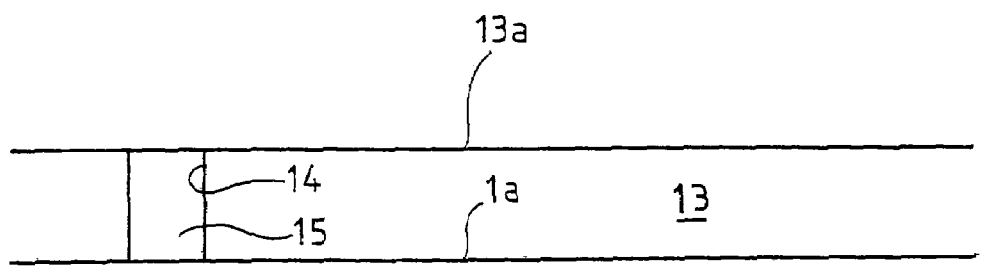
1

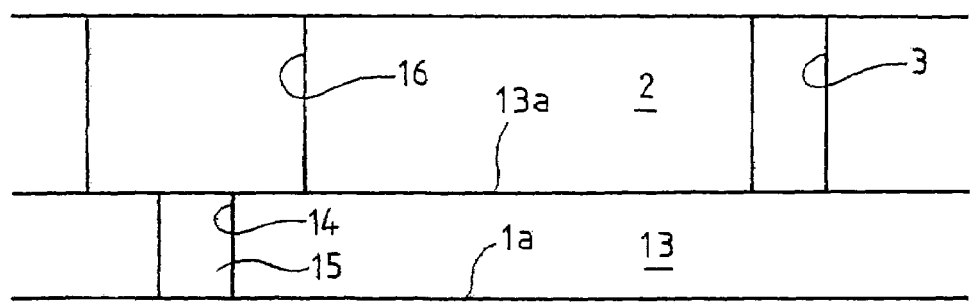
FIG_4

FIG_5
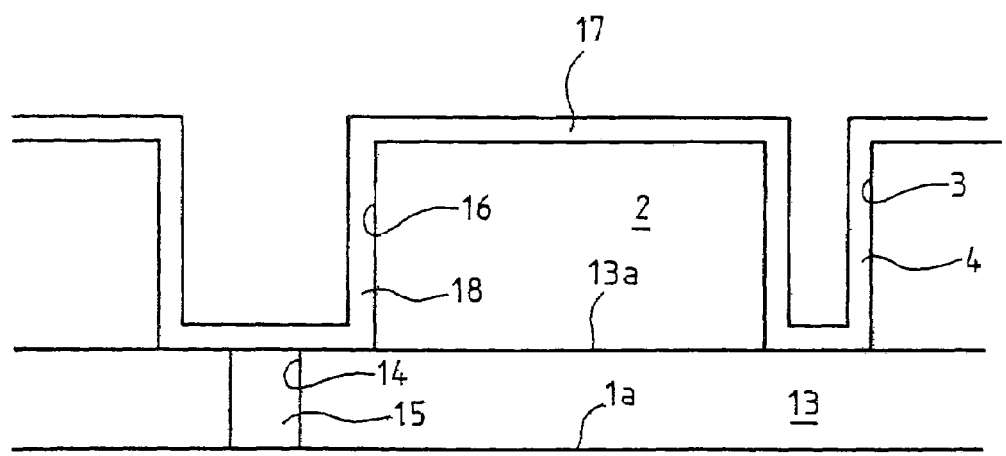

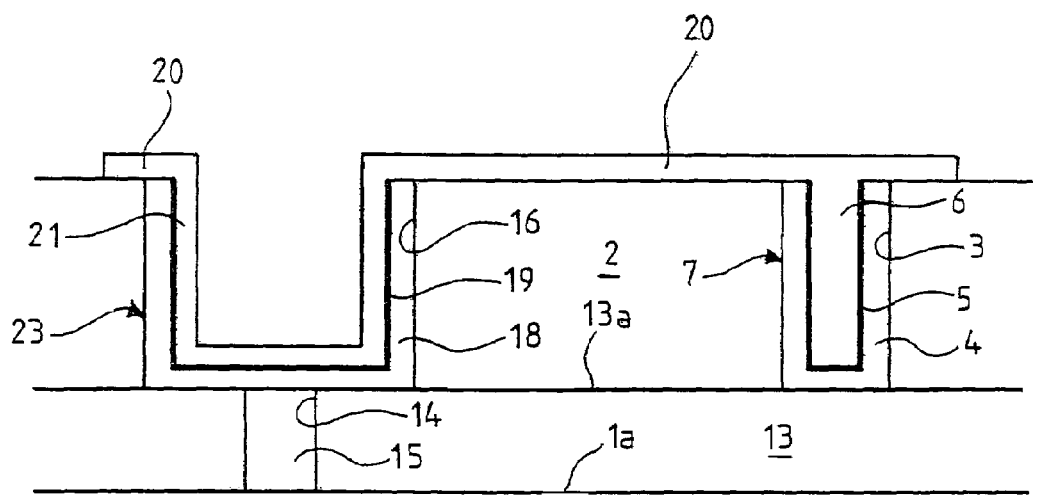

FIG_7
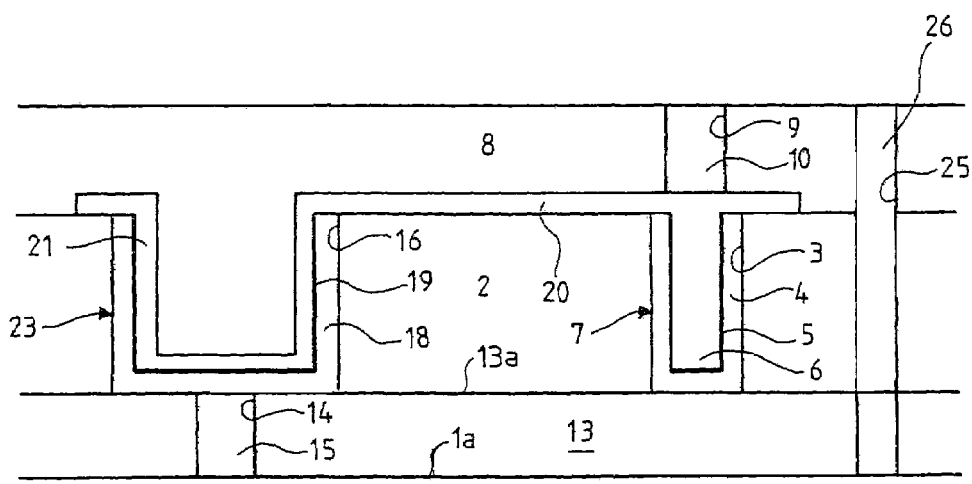

INTEGRATED CIRCUIT, ITS FABRICATION PROCESS AND MEMORY CELL INCORPORATING SUCH A CIRCUIT

CROSS-REFERENCE TO RELATED APPLICATIONS

This application is based upon and claims priority from prior French Patent Application No. 01/10868, filed Aug. 16, 2001, the entire disclosure of which is herein incorporated by reference.

BACKGROUND OF THE INVENTION

The present invention relates in general to integrated circuits. More particularly, the present invention relates to memory cells, especially of the dynamic random access (DRAM) type which are compatible with a process for fabricating a device incorporating such a memory and CMOS components.

Conventionally, a DRAM memory is in the form of rows and columns at the intersections of which are memory cells consisting of a memory element, typically a capacitor, and of a switch for controlling this memory element, in general an MOS transistor.

A DRAM-type memory cell (FIG. 1) consists of a control MOS transistor T and a storage capacitor C which are connected in series between an electrical earth M and a bit line BL. The gate of the control transistor T is connected to a word line WL. The transistor T controls the flow of electrical charges between the capacitor C and the bit line BL. The electrical charge on the capacitor C determines the logic level, 1 or 0, of the memory cell. When reading the memory location, the capacitor C discharges into the bit line BL. To read the value of the electrical charge on the storage capacitor C quickly and reliably, the capacitance of this capacitor must be high compared with the capacitance presented by the bit line BL during the reading phase.

A large number of DRAM cells formed in this way are grouped together in the form of a matrix so as to generate a memory plane which may comprise millions of elementary cells. For some applications, the memory plane lies within a complex integrated circuit. One therefore speaks of on-board memory.

The memory elements are structures based on capacitors having a first electrode consisting of a base in contact with a diffusion region of an MOS transistor and of an approximately horizontal plateau. Memory capacitors also have a very thin dielectric and a second electrode common to several capacitors and consisting of a continuous conducting layer, for example made of polycrystalline silicon, lying above the very thin dielectric. The second electrode is then covered with a thick dielectric layer.

It is necessary to produce an electrical contact between a second electrode of a capacitor and the upper surface of the said thick dielectric layer on which a level provided with conducting tracks, also called a metallization level or conducting level, may be placed.

Conventionally, this electrical contact may be made by providing a connection structure formed, for example, during production of the dielectric layer, extending either above the capacitor or offset with respect to the latter.

This technique has a major drawback in so far as, in particular, because of the conformation of the capacitor, the electrical contacts between the connection structure and the electrode of the capacitor are relatively poor in quality.

Moreover, since this connection structure is generally coupled to a via ensuring connection to the substrate, the difference in depth between the capacitor and the latter greatly complicates the production of the circuit, in particular as regards the etching phases. The term "via" is understood to mean, within the context of the present invention, a hole filled with an electrically conductive material capable of forming an electrical connection between two or more levels of an integrated circuit.

Finally, in order to reduce the fabrication costs, the problem of how to simultaneously produce all the electrical contacts arises.

SUMMARY OF THE INVENTION

The invention provides a structure particularly suitable for producing contacts between the level of the second electrodes of the memory cells and a conducting level lying above it.

The invention provides an integrated circuit having a connection structure, similar to a fictitious capacitor, allowing a via to be produced above the said fictitious capacitor.

According to one aspect of the invention, the integrated circuit comprises a capacitor formed above a substrate inside a first cavity in a dielectric and comprising a first electrode, a second electrode, a thin dielectric layer placed between the two electrodes, and a structure for connection to the capacitor.

The connection structure is formed at the same level as the capacitor in a second cavity narrower than the first cavity, the said second cavity being completely filled by an extension of at least one of the electrodes of the capacitor.

The connection structure constitutes a second capacitor or fictitious capacitor.

The first electrode of the second capacitor may be surrounded with a dielectric. It is not meant to be electrically connected to other elements. The second electrode of the second capacitor is electrically connected to at least one other second electrode of the capacitor of the circuit.

In one embodiment of the invention, the circuit comprises a via in contact with the second electrode and placed above it. The via passes through the thick dielectric layer placed above the second electrodes and ensures electrical contact with at least one upper conducting level.

Preferably, the capacitor and the connection structure are formed from the same materials.

The integrated circuit may also comprise an MOS transistor connected to the first electrode of the capacitor in order to constitute a memory cell.

The invention also provides a DRAM memory cell incorporating an integrated circuit as defined above.

Finally, the invention provides a process for fabricating an integrated circuit. According to one aspect of this process, a first capacitor and a connection structure similar to a second capacitor or fictitious capacitor are formed simultaneously, each comprising a first electrode having, in section, a U-shaped cross section, a second electrode at least partly placed in the U and a thin dielectric layer placed between the two electrodes, the second electrode of the second capacitor filling the cavity between the branches of the U which is left by the said first electrode, the second capacitor having the same shape as and a smaller width than the first capacitor.

More particularly, simultaneously with the etching of a first cavity in a thick dielectric layer intended to house a first capacitor, a second cavity, of smaller width than the first cavity, is etched in order to form a second capacitor. Next, the first and second capacitors are formed simultaneously, each being provided with a first electrode, a thin dielectric layer and a second electrode, the second electrode of the second capacitor filling the rest of the second cavity left by the first electrode and the thin dielectric layer. Next, a first via is formed in the second electrode of the second capacitor so as to be in alignment with the latter, the said via passing through a dielectric layer and allowing electrical connection to a conducting level lying above the said dielectric layer, and, at the same time, a second via is formed, which passes through the circuit as far as the substrate and allows electrical connection to the latter.

More particularly, the first and second capacitors may be formed on a local dielectric layer.

The first and second capacitors may be formed by deposition of a conducting layer, for example made of polysilicon or metal, over the entire surface, local or otherwise, of the circuit being fabricated, that is to say on the upper surface of the dielectric layer in which the cavities have been formed, in the bottom of the cavities and on the sidewalls of the said cavities.

The conducting layer is then removed from the upper surface of the said dielectric layer by chemical-mechanical polishing or by etching. Next, one or more thin layers of a dielectric are deposited, again over the entire surface, local or otherwise, of the circuit being fabricated, that is to say on the first electrode formed by the conducting layer remaining in the cavities and on the upper surface of the dielectric layer in which the cavities are formed. Next, a further conducting layer is deposited, intended to form the second electrode, again over the entire surface, local or otherwise, of the integrated circuit.

The said conducting layer and the thin dielectric layer or layers are removed, by a selective etching step, from part of the upper surface of the thick dielectric layer in which the cavities are formed. It is thus possible to leave connections lying on the thick dielectric layer. The width of the second cavity is such that the conducting layer intended to form the second electrode completely fills the cavity left after the first electrode and the thin dielectric layer or layers have been deposited.

More particularly, the via lying above the second electrode of the second capacitor and intended to ensure connection to the latter, together with the deeper via or vias intended for connection to the substrate may be obtained simultaneously by a conventional process or by a damascene process.

The step of forming the via between the upper surface of the second electrode of the second capacitor and an upper conducting level, the second electrode filling the entire residual cavity, makes it possible to avoid having a via which goes right down to the bottom of the said cavity with the presence of polysilicon sidewalls disturbing the filling of the via and not ensuring a reliable contact. Furthermore, the via is of short length and consequently easier to fill with metal. The second capacitor is of smaller width and therefore has a smaller footprint in terms of the area of silicon used.

Furthermore, by producing the via so as to be in alignment with the second capacitor, above the latter, it is possible to avoid impairing the structure of the circuit in so far as, during etching of the hole to produce the via, a thickness of silicon is sufficient in this region to avoid any damage to this silicon layer, even when this region will be etched during the etching step.

It will in fact be understood that if a via were to be formed above the capacitor, it would be necessary to reach the bottom of the remaining cavity, left by the second electrode of the capacitor, which would require etching over a great depth and the formation of a via also over the same great depth, this being relatively difficult to achieve.

Furthermore, the presence of the sidewalls of the said second electrode disturbs the filling of such a via and results in a contact of poor quality or else a resistance liable to vary greatly from one capacitor to another.

Thus, the types of etching used do not pose selectivity problems because of the very large thickness of the connection structure consisting at this point of the second electrode of the fictitious capacitor. Consequently, should an etching operation damage the bottom of the via associated with the connection structure, good selectivity would be preserved because of the relatively large thickness of the silicon within this structure.

When the via is formed by a damascene process, if the etching through the upper dielectric layer is too deep and etches into part of the second electrode, in all cases a contact of excellent quality is maintained. In other words, the steps for producing the capacitors, for example DRAM cells, are advantageously employed to produce a false capacitor allowing contact between the level of the second capacitor electrodes and an upper conducting level, without adding an additional step, which is therefore particularly economic.

As an example, it possible to provide a first electrode having a thickness of about 1000 Å, a second electrode having a thickness of about 1000 Å and a cavity width of the second capacitor of about 4000 Å.

BRIEF DESCRIPTION OF THE DRAWINGS

The present invention will be more clearly understood on studying the detailed description of one embodiment given as an example, but in no way limiting, and illustrated by the appended drawings in which:

FIG. 1, already mentioned, is a schematic view of a memory cell;

FIG. 2 is a sectional view of a portion of the integrated circuit according to one aspect of the invention; and FIGS. 3 to 7 show steps in the fabrication of a circuit according to a variant of FIG. 2.

DETAILED DESCRIPTION OF PREFERRED EMBODIMENTS

FIG. 2 shows a connection structure intended to be used in an integrated circuit to make an electrical connection with a capacitor of a memory cell. In the embodiment example considered, this structure constitutes a fictitious capacitor.

As may be seen in this figure, an integrated circuit comprises a substrate 1 provided with an upper surface 1a on which active structures have been formed by ion implantation, the structures not being shown for the sake of clarity of the drawing.

After the active structures have been formed, a lower dielectric layer 13 is deposited on the upper surface 1a of the substrate 1 and on the upper surface of the said active structures, and an intermediate dielectric layer 2, which may made of silicon oxide, silicon nitride, a glassy boron-phosphorus-silicon alloy (BPSG) or a glassy phosphorus-silicon alloy (PSG), or any other material having suitable dielectric properties, may be produced on this lower dielectric layer 13.

Next, an etching step is carried out, which allows a hole 3 to be opened into the intermediate dielectric layer 2, the bottom of the hole being formed by the upper surface of the dielectric.

Next, a polysilicon layer is deposited, over the entire surface of the circuit being fabricated, in order to form the first electrode 4 of the capacitor. The polysilicon layer covers the upper surface of the intermediate dielectric layer 2, the bottom 3b and the sidewalls 3a of the hole 3. The polysilicon layer is removed from the upper surface of the intermediate dielectric layer 2 by etching or by chemical-mechanical polishing. As a variant, the layer may be made of metal instead of polycrystalline silicon.

Next, one or more layers of dielectric are deposited with a very small thickness on the upper surface of the circuit being fabricated, that is to say on the upper surface of the intermediate dielectric layer 2 and on the polysilicon surfaces of the first electrode 4. These dielectric layers, labelled 5, generally two in number, have been shown in FIG. 2 in the form of a thick line because of their small thickness relative to the other layers.

Next, a conducting layer, for example made of polysilicon, is deposited in order to form the second electrode 6. The said polysilicon layer fills the space in the hole 3 left free by the first electrode 4 and the dielectric layers 5, and covers the upper surface of the intermediate dielectric layer 2. The said polysilicon layer is then etched in order to remove it at least partly from the upper surface of the intermediate dielectric layer 2, except at least along the edges of the hole 3, so that the second electrode 6 has a part 6a lying in the hole 3 and an upper part 6b extending laterally on each side of the hole 3 on the upper surface of the intermediate dielectric layer 2 in order to make an electrical connection to the capacitor of a memory cell. The dielectric layers 5 therefore form the dielectric of the capacitor, labelled 7 overall, comprising a first electrode 4, the dielectric layer or layers 5 and the second electrode 6.

The conducting layer forming the second electrode 6 may also be left partly on the upper surface of the dielectric layer 2 in order to form interconnections and, in particular, to connect, between them, a plurality of second electrodes of a plurality of capacitors of adjacent memory cells.

Next, a thick dielectric layer 8, for example made of silicon oxide, is deposited over the entire integrated circuit. A first hole 9 is hollowed out in the upper surface 8a of the dielectric layer 8. The hole 9 passes through the dielectric layer 8 and reaches the upper portion 6b of the second electrode 6 of the capacitor 7. The hole 9 is then filled with conductive material, especially metal, in order to form a conducting via 10 which will preferably be in alignment with the hole 3. In other words, there is a via 10 connecting the second electrode 6 to the upper surface 8a of the dielectric layer 8. Thanks to the particular position of the via 10, aligned with the hole 3 filled with the electrode 6, it is unnecessary to take special precautions when etching the hole 9, which may even be partly etched into the thickness of the portion 6b, as indicated above.

Once the dielectric layer has been deposited and the hole 9 hollowed out and filled with a conductive material in order to form the via 10, a metal layer 11 is deposited and then etched. This layer 11 is in electrical contact with the upper part of the via 10 and forms the first metal interconnection level.

FIGS. 3 to 7 illustrate the various steps in the fabrication of a portion of an integrated circuit comprising a first capacitor, for example intended for a DRAM memory cell, a second capacitor suitable for forming a via lying above the latter and intended for connecting one of the electrodes of the first capacitor and a connection via intended for electrical connection to the substrates on which the capacitors are formed.

In FIG. 3, a lower dielectric layer 13 has been deposited on the substrate 1. A first hole 14 is hollowed out by etching, through the dielectric layer 13 until it reaches the upper surface 1a of the substrate 1. The hole 14 is then filled with metal in order to form a connection via 15 between the upper surface 13a of the dielectric layer 13 and the substrate 1, more particularly an active region, not shown, formed by doping in the substrate 1.

In FIG. 4, it may be seen that an intermediate dielectric layer 2 has then been deposited on the upper surface 13a of the dielectric layer 13 and on the upper surface of the via 15. This dielectric layer 2 is subjected to an etching step which allows a large hole 16, for example about 0.4×0.8 µm in size, and a smaller hole 3, for example 0.3×0.3 µm in size, to be formed.

In FIG. 5, it may be seen that a conducting layer 17, for example made of polysilicon, has been deposited over the entire surface of the circuit portion being fabricated, that is to say on the upper surface of the intermediate dielectric layer 2, on the bottom and on the sidewalls of the holes 3 and 16, the said conducting layer 17 being intended to form the first electrodes of the capacitors, especially the first electrodes 4 in the hole 3 and the first electrode 18 in the hole 16.

The conducting layer 17 is then removed from the upper surface of the intermediate dielectric layer 2 by anisotropic etching or by chemical-mechanical polishing, so that the said conducting layer 17 remains only on the bottom and on the sidewalls of the holes 3 and 16. Next, one or more thin dielectric layers are deposited over the entire integrated circuit portion being fabricated and intended to form the dielectric of the capacitor. The thin layer or layers have been shown in the form of a thick line because of their very small thickness and they are labelled 5 in the hole 3 covering the first electrode 4 and labelled 19 in the hole 16 covering the first electrode 18. A conducting layer 20, for example made of polysilicon, is then deposited over the entire surface of the integrated circuit being fabricated, that is to say it covers the upper surface of the dielectric layer 2, the bottom and the sidewalls of the cavity remaining in the hole 16 and completely filling the cavity remaining in the hole 3 (FIG. 6).

An anisotropic etching step is carried out to remove the conducting layer 20 from part of the upper surface of the dielectric layer 2, where its presence is not desired. The conducting layer 20 thus forms a second electrode 6 in the hole 3 and a second electrode 21 in the hole 16. However, a strip of the conducting layer 20 joining the electrodes 6 and 21 has been left so that the latter are electrically connected together. This strip may be of relatively small width so as to occupy only a small area in the circuit. A capacitor of normal width, labelled 23 in its entirety and formed in the hole 16, and a connection structure 7 similar to a capacitor, of smaller width, formed in the hole 3, are thus produced. The connection structure 7 is called the "second capacitor" or fictitious capacitor in the present description since the first electrode 4 is electrically isolated and this fictitious capacitor is not used during operation of the integrated circuit. A very thick dielectric layer 8 (FIG. 7) is then deposited over the entire circuit portion being fabricated.

In order for the connection structure 7 to be electrically connected to the substrate 1, a step of etching the circuit is carried out so as to form the hole 9, lying above the fictitious capacitor and in alignment with the latter, and a second hole 26.

As may be seen in FIG. 7, the first hole 9 passes through the dielectric layer 8 and lies between the upper conducting level and the conducting layer 20.

As regards the second hole 25, this passes through the entire circuit right to the substrate 1 and therefore extends through the conducting layer 8 and the dielectric layers 2 and 13 as far as the substrate.

The benefit of producing the first hole 9 above and in alignment with the connection structure will therefore be appreciated.

This is because, since the second hole 25 has a substantially greater depth than the first hole 9, with regard to the connection structure, the etching phase, which continues until the second hole 24 has been completed, is capable of etching the material lying beneath the dielectric layer, namely the conducting layer.

Because of the relatively large thickness of this layer in this region, it is unnecessary to take special precautions to protect this layer.

During the next step, an electrically conductive material is deposited in the holes 9 and 25 so as to form the via 10, for connecting to the connection structure, and a second via 26, for connecting to the substrate 1.

The connection structure 7 forms an excellent via support capable of ensuring a high-quality contact with a low and relatively constant resistance between one circuit and another or between one circuit wafer and another.

The via 10 may be used to connect a plurality of second electrodes of the capacitors, such as the capacitor 23, for example the capacitors arranged in a row or else the capacitors arranged in a column of a DRAM-type cell matrix. The via 15 is used to connect the first electrode of the capacitor 23 to an active region formed in the substrate 1, for example to the drain or to the source of an MOS transistor, allowing the capacitor 23 to be charged or discharged.

Furthermore, as mentioned above, if the hole 9 is etched too deeply and the conducting layer 20 forming the second electrode is etched into, the electrical contact will remain of good quality because of the very large thickness of the conducting layer present beneath the via 10. A not very selective etching process can therefore be used for this step.

To increase the selectivity of the etching steps, it is possible to use stop layers between the various dielectric layers. For the sake of simplifying the drawing, the said stop layers have not been shown.

Preferably, the width of the hole 3 will be between 200 and 6000 Å. The cross section of the hole 3 will preferably be approximately circular, especially because of the etching process. The thickness of the first electrode may be between 500 and 2000 Å and the thickness of the second electrode may also be between 500 and 2000 Å.

Finally, it will be noted that the invention is not limited to the embodiment described above. This is because, whereas in the embodiment example envisaged, the connection structure is made from an extension of the first and second electrodes of the capacitor, that is to say the upper electrode of the capacitor, it is also possible, as a variant, to produce this structure from an extension of either of these electrodes.

What is claimed is:

1. An integrated circuit comprising:
    a capacitor disposed on a first level above a substrate located inside a first cavity of a dielectric, the capacitor including:
        a first electrode;
        a second electrode; and
        a dielectric layer located between the two electrodes; and
    a structure for connection to the capacitor, the structure being located on the first level in a second cavity narrower than the first cavity, the second cavity being completely filled by an extension of at least one of the electrodes of the capacitor, the structure comprising at least one electrode that is electrically isolated.

2. The integrated circuit of claim 1, further comprising a via disposed above the structure and in contact with the structure.

3. The integrated circuit of claim 2, wherein the structure is located on a local dielectric layer placed on the substrate.

4. The integrated circuit of claim 2, wherein the capacitor and the structure are composed of the same material.

5. The integrated circuit of claim 2, further comprising a via for connection to the substrate.

6. The integrated circuit of claim 2, wherein the structure comprises a second capacitor, the second capacitor including:
    the one electrode of the structure that is electrically isolated;
    a second electrode of the second capacitor that is the extension of one of the electrodes of the capacitor; and
    a dielectric layer located between the one electrode of the structure and the second electrode of the second capacitor.

7. The integrated circuit of claim 1, wherein the structure is located on a local dielectric layer placed on the substrate.

8. A DRAM memory cell comprising:
    a capacitor disposed on a first level above a substrate located inside a first cavity of a dielectric, the capacitor including:
        a first electrode;
        a second electrode; and
        a dielectric layer located between the first and second electrodes; and
    a structure for connection to the capacitor, the structure being located on the first level in a second cavity narrower than the first cavity, the second cavity being completely filled by an extension of at least one of the electrodes of the capacitor, the structure comprising a third electrode that is electrically isolated.

9. The DRAM memory cell of claim 8, further comprising a via disposed above the structure and in contact with the structure.

10. The DRAM memory cell of claim 9, wherein the structure is located on a local dielectric layer placed on the substrate.

11. The DRAM memory cell of claim 9, wherein the capacitor and the structure are composed of the same material.

12. The DRAM memory cell of claim 9, further comprising a via for connection to the substrate.

13. The DRAM memory cell of claim 8, wherein the structure comprises a second capacitor, the second capacitor including:
    the third electrode that is electrically isolated;
    a fourth electrode that is the extension of one of the electrodes of the capacitor; and
    a dielectric layer located between the third electrode and the fourth electrode.

14. A method for fabricating an integrated circuit, the method comprising the steps of:
    providing a substrate; and
    forming above the substrate a first capacitor and a connection structure for the first capacitor, the connection structure having the same shape as the first capacitor and a smaller width than the first capacitor, the connection structure comprising a first electrode that is electrically isolated,
    wherein the connection structure includes:

the first electrode which has a U-shaped cross section;

a second electrode located at least partly within a cavity of the U-shape of the first electrode, the second electrode substantially filling the cavity of the U-shape of the first electrode; and a thin dielectric layer located between the first electrode and the second electrode.

15. The method of claim 14, wherein the first capacitor and the connection structure are formed on a local dielectric layer.

16. The method of claim 14, wherein the forming step includes the sub-steps of:

depositing a first conducting layer over a surface of the integrated circuit;

removing the first conducting layer from the surface of a thick dielectric layer;

depositing one or more thin layers of a dielectric over the surface of the integrated circuit;

depositing a second conducting layer over the surface of the integrated circuit; and removing the second conducting layer from a portion of the surface of the thick dielectric layer.

17. The method of claim 16, wherein the width of a cavity in which the connection structure is formed is such that the second conducting layer deposited over the surface of the integrated circuit substantially fills a cavity remaining after the first electrode of the connection structure and the thin dielectric layer of the connection structure are formed.

* * * * *